(12) United States Patent
Sawada et al.

(10) Patent No.: US 8,178,850 B2
(45) Date of Patent: May 15, 2012

(54) CHROMATIC ABERRATION CORRECTOR FOR CHARGED-PARTICLE BEAM SYSTEM AND CORRECTION METHOD THEREFOR

(75) Inventors: Hidetaka Sawada, Tokyo (JP); Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 352 days.

(21) Appl. No.: 12/573,973

(22) Filed: Oct. 6, 2009

(65) Prior Publication Data
US 2010/0084567 A1    Apr. 8, 2010

(30) Foreign Application Priority Data
Oct. 6, 2008 (JP) .................................. 2008-259915

(51) Int. Cl.
*G21K 1/08* (2006.01)
*H01J 3/14* (2006.01)
*H01J 3/26* (2006.01)
*H01J 49/42* (2006.01)

(52) U.S. Cl. .................................................. 250/396 R
(58) Field of Classification Search ........... 250/396 ML, 250/396 R, 306, 307, 310, 311
See application file for complete search history.

(56) References Cited

U.S. PATENT DOCUMENTS

| 5,221,844 A * | 6/1993 | van der Mast et al. ........ 250/398 |
| 6,723,997 B2 | 4/2004 | Matsuya et al. |
| 2005/0247884 A1 * | 11/2005 | Nakamura et al. ........ 250/396 R |

FOREIGN PATENT DOCUMENTS

JP    A 2003-203593    7/2003

OTHER PUBLICATIONS

O. Scherzer, "Sphärische und chromatische Korrektur von Elektronen-Linsen," Optik, vol. 2, pp. 114-132 (1947).
H. Rose, "Outline of a spherically corrected semiaplanatic medium-voltage transmission electron microscope," Optik, vol. 85, No. 1, pp. 19-24 (1990).

* cited by examiner

*Primary Examiner* — Jack Berman
*Assistant Examiner* — Meenakshi Sahu
(74) *Attorney, Agent, or Firm* — The Webb Law Firm

(57) ABSTRACT

An aberration corrector has two stages of multipole elements each of which has a thickness along the optical axis. Each multipole element produces a static electric or magnetic field of 3-fold symmetry and a static electromagnetic field of 2- or 3-fold symmetry superimposed on the static electric or magnetic field. In each of the multipole elements, the static electromagnetic field is so set that magnetic and electric deflecting forces on an electron beam accelerated by a given accelerating voltage substantially cancel out each other. Thus, chromatic aberration is corrected. Also, spherical aberration is corrected by the static electric or magnetic fields of 3-fold symmetry produced by the multipole elements.

16 Claims, 5 Drawing Sheets

CHROMATIC ABERRATION CORRECTOR FOR CHARGED-PARTICLE BEAM SYSTEM AND CORRECTION METHOD THEREFOR

BACKGROUND OF THE INVENTION

1. Field of the Invention

The present invention relates to a chromatic and spherical aberration corrector for use in a charged-particle beam system and to an aberration correction method for the system. More particularly, the invention relates to a chromatic and spherical aberration corrector using multipole elements making use of superimposed electric and magnetic fields for providing simultaneous correction of chromatic and spherical aberrations and to an aberration correction method therefor.

2. Description of Related Art

In an electron beam apparatus, such as a transmission electron microscope (TEM) or a scanning electron microscope (SEM), spherical aberration and chromatic aberration are main factors deteriorating spatial resolution. Especially, an axisymmetric lens produces positive spherical aberration in essence and, therefore, it is impossible to produce a concave lens action from this lens. On the other hand, with respect to chromatic aberration, it is impossible to remove the chromatic aberration using an axisymmetric lens. Therefore, rotationally symmetric fields produced by a multipole element are used to correct these aberrations.

O. Scherzer, *Optik*, Vol. 2 (1947), pp. 114-132 and H. Rose, *Optik*, Vol. 85, No. 1 (1990), pp. 19-24 set forth a spherical aberration corrector using two stages of hexapole elements. This aberration corrector has a pair of transfer lenses, each consisting of an axisymmetric lens, and hexapole elements disposed at the nodal points of the transfer lenses at the opposite sides. The two stages of hexapole elements produce negative third-order spherical aberration. Spherical aberration in the whole system is removed by combining the hexapole elements with an objective lens.

On the other hand, JP-A-2003-203593 sets forth a chromatic aberration corrector in which electric field-type quadrupoles and magnetic field-type quadrupoles are combined. The chromatic aberration corrector has four stages of multipole elements. The first and fourth stages of multipole elements are electric field-type quadrupole elements. The second and third stages of multipole elements have electric field-type and magnetic field-type quadrupole elements. That is, these multipole elements are of a so-called superimposed electric and magnetic field type.

In this chromatic aberration corrector, chromatic aberration is corrected in the x- and y-directions independently if the optical axis is taken in the z-direction. Therefore, the correction produces a lens action which makes an electron beam diverge in one of the x- and y-directions and which converges the beam in the other. That is, so-called line focusing is achieved.

The first stage of multipole element is mounted for the line focusing. For example, where this multipole element exerts a diverging action on the electron beam in the x-direction and a converging action in the y-direction, the multipole element forms a linear electron beam extending in the x-direction in the center of the second stage of multipole element. The second stage of multiple element corrects chromatic aberration in the x-direction and, at the same time, produces a linear electron beam extending in the y-direction on the third stage of multipole element. The third stage of multipole element corrects chromatic aberration in the y-direction in the same way as the second stage of multipole element. Finally, the fourth stage of multipole element performs an operation reverse to line focusing, i.e., returns the linear electron beam to its original shape. In this case, in the center of the second stage of multipole element, the beam represents a reciprocal space image in the x-direction and a real space image in the y-direction. Conversely, in the center of the third stage of multipole element, the electron beam represents a real space image in the x-direction and a reciprocal space image in the y-direction.

In the second and third stages of multipole elements, the deflecting force exerted on the electron beam by an electric field-type quadrupole is linearly proportional to the position of the beam within the multipole elements. Because the position of the beam in the reciprocal space image corresponds to the angle of incidence of the beam impinging on the first multipole element, it can be said that the deflecting force is linearly proportional to the angle of incidence. Furthermore, a similar principle applies to the deflecting force exerted on the beam by a magnetic field-type quadrupole. Accordingly, the deflecting forces of the fields on the electron beam having a given energy can be made to cancel out each other by appropriately adjusting electric and magnetic fields produced by the electric field-type quadrupole and magnetic field-type quadrupole, respectively, in each of the second and third multipole elements. The obtained orbit is not different from a reference orbit assumed where aberrations are not taken into consideration.

On the other hand, the refractive index of an electron beam (i.e., dependence of the deflecting force on wavelength or on accelerating force) relative to an electric field is different from the refractive index of the beam relative to a magnetic field. Accordingly, where a deflecting force on the electron beam is canceled out by a combination of electric and magnetic fields, the beam does not deviate from the reference orbit. Only the refractive index relative to the electron beam varies on the orbit. Chromatic aberration can be corrected by setting a refractive index created by the magnetic and electric quadrupoles so as to cancel out the refractive index of the objective lens.

In the above-described chromatic aberration corrector, line focusing is performed to correct chromatic aberration only in one direction. Therefore, real space image and reciprocal space image of an electron beam are focused at positions different between the x- and y-directions.

That is, an appropriate electron beam obtained by the above-described chromatic aberration corrector has a limited beam diameter for irradiating only a small field of view. Therefore, the corrector can be introduced into a scanning electron microscope (SEM) or a scanning transmission electron microscope (STEM). In the case of a transmission electron microscope (TEM), a wide range on the surface of a specimen needs to be covered with a single shot of the electron beam and be irradiated with it. Therefore, it is difficult to correct chromatic and spherical aberrations for the electron beam and thus it is difficult to utilize the aforementioned corrector.

Hence, this instrument cannot be used in TEM. Furthermore, if the electron beam is made to diverge excessively in one direction by line focusing, there is the danger that the beam collides against the inner wall of the vacuum vessel. If such a collision takes place, emission and scattering of electrons produce undesired noise. In addition, the degree of vacuum may be deteriorated uselessly.

SUMMARY OF THE INVENTION

Accordingly, it is an object of the present invention to provide a chromatic aberration corrector capable of correcting chromatic aberration and spherical aberration simultaneously for a charged-particle beam having a large diameter without performing line focusing.

A first embodiment of the present invention provides a chromatic aberration corrector which achieves the foregoing object and which is used to correct chromatic aberration in a charged-particle beam. The chromatic aberration corrector has a first and a second multipole element. The first multipole element has a first thickness along the optical axis of the charged-particle beam and produces a first static electromagnetic field of 2-fold symmetry. The second multipole element is mounted on the optical axis, has a second thickness along the optical axis, and produces a second static electromagnetic field of 2-fold symmetry. When the beam is accelerated by a given accelerating voltage, the first and second static electromagnetic fields cancel out 2-fold astigmatism in the charged-particle beam due to the magnetic field while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of the objective lens.

The chromatic aberration corrector which is based on the chromatic aberration corrector of the first embodiment is further characterized in that a static electric or magnetic field of 4-fold symmetry is superimposed on the first multipole element and a static electric or magnetic field of 4-fold symmetry is superimposed on the second multipole element, because each of the 4-fold astigmatism produced by the first multipole element and the second multipole element are cancelled out, respectively.

The chromatic aberration corrector which is based on the chromatic aberration corrector of the first embodiment is further characterized in that a static electric or magnetic field of 3-fold symmetry is superimposed on the first multipole element and a static electric or magnetic field of 3-fold symmetry is superimposed on the second multipole element, because the static symmetric electric field of 2-fold symmetry and the symmetric magnetic field of 2-fold symmetry cancel out each other within the range given by the above-described formula as described previously. As a result, correction of a spherical aberration using the fields of 3-fold symmetry can be realized. Consequently, chromatic aberration and spherical aberration can be corrected at the same time.

The chromatic aberration corrector associated with the first embodiment of the present invention may further include a third multipole element which is mounted on the optical axis, has a third thickness along the optical axis, and produces a third static electric or magnetic field of 3-fold symmetry.

Another chromatic aberration corrector which is based on the chromatic aberration corrector of the first embodiment is further characterized in that a static electric or magnetic field of 4-fold symmetry is superimposed on the first multipole element, and a static electric or magnetic field of 4-fold symmetry is superimposed on the second multipole element, because the static symmetric electric field of 2-fold symmetry and the symmetric magnetic field of 2-fold symmetry cancel out each other within the range given by the above-described formula as described previously. As a result, correction of a spherical aberration using the fields of 4-fold symmetry can be realized. Consequently, chromatic aberration and spherical aberration can be corrected at the same time.

Another chromatic aberration corrector associated with the first embodiment of the present invention may further include a third multipole element which is mounted on the optical axis, and has a third thickness along the optical axis, and produces a third static electric or magnetic field of 4-fold symmetry.

Another chromatic aberration corrector associated with the first embodiment of the present invention may further include a third multipole element and a fourth multipole element. The third multipole element which is mounted on the optical axis and has a third thickness along the optical axis produces a third static electromagnetic field by superimposing a static electromagnetic field of 2-fold symmetry and a static electric or magnetic field of 4-fold symmetry. The fourth multipole element which is mounted on the optical axis, and has a fourth thickness along the optical axis produces a fourth static electromagnetic field by superimposing a static electromagnetic field of 2-fold symmetry and a static electric or magnetic field of 4-fold symmetry.

In addition to the above-described configuration, a pair of first transfer lenses may be mounted between the multipole elements.

Furthermore, a pair of second transfer lenses may be mounted between the multipole element adjacent to the objective lens of the charged-particle beam system and the objective lens.

The first and second thicknesses may be different.

In each of the first and second multipole elements, magnetic poles producing magnetic fields may be quadrupoles or dodecapoles.

In the first multipole element, electrodes producing a static electric field for creating the first static electromagnetic field are disposed in a vacuum. Magnetic poles producing a static magnetic field for creating the first static electromagnetic field are disposed outside the vacuum. In the second multipole element, electrodes producing a static electric field for creating the second static electromagnetic field are disposed in the vacuum. Magnetic poles producing a static magnetic field for creating the second static electromagnetic field are disposed outside the vacuum.

A second embodiment of the present invention provides a method of correcting chromatic aberration in a charged-particle beam system. This method starts with producing a first static electromagnetic field of 2-fold symmetry along the optical axis of a charged-particle beam. A second static electromagnetic field of 2-fold symmetry is produced along the optical axis. When the charged-particle beam is accelerated by a given accelerating voltage, the first and second static electromagnetic fields cancel out 2-fold astigmatism in the charged-particle beam due to the magnetic field while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of the objective lens.

The method of correcting chromatic aberration which is based on the method of correcting chromatic aberration of the second embodiment is further characterized in that a static electric or magnetic field of 4-fold symmetry is superimposed on the first static electromagnetic field of 2-fold symmetry and a static electric or magnetic field of 4-fold symmetry is superimposed on the second static electromagnetic field of 2-fold symmetry, because each of the 4-fold astigmatism produced by the first static electromagnetic field of 2-fold symmetry and the second static electromagnetic field of 2-fold symmetry are cancelled out, respectively.

In the method of correcting chromatic aberration in accordance with the second embodiment, chromatic and spherical aberrations are corrected at the same time by superimposing a static electric or magnetic field of 3-fold symmetry on the first static electromagnetic field and superimposing a static electric or magnetic field of 3-fold symmetry on the second static electromagnetic field.

In the method of correcting chromatic aberration in accordance with the second embodiment, a third static electric or magnetic field of 3-fold symmetry along the optical axis may be produced.

In another method of correcting chromatic aberration in accordance with the second embodiment, chromatic and spherical aberrations are corrected simultaneously by superimposing a static electric or magnetic field of 4-fold symmetry on the first multipole element and superimposing a static electric or magnetic field of 4-fold symmetry on the second multipole element.

In another method of correcting chromatic aberration in accordance with the second embodiment, a third static electric or magnetic field of 4-fold symmetry using a third multipole element which is mounted on the optical axis, and has a third thickness along the optical axis may be produced.

In another method of correcting chromatic aberration in accordance with the second embodiment, a third static electromagnetic field and a fourth static electromagnetic field may be further produced. The third static electromagnetic field is produced by superimposing the static electromagnetic field of 2-fold symmetry and the electric or magnetic field of 4-fold symmetry using a third multipole element which is mounted on the optical axis, and has a third thickness along the optical axis. The fourth static electromagnetic field is produced by superimposing the static electromagnetic field of 2-fold symmetry and the electric or magnetic field of 4-fold symmetry using a fourth multipole element which is mounted on the optical axis, and has a fourth thickness along the optical axis.

According to the chromatic aberration corrector and method therefor of the present invention, chromatic aberration can be corrected without performing line focusing. Therefore, spherical aberration can be corrected at the same time. Accordingly, the aberration corrector and method can be applied to correction of chromatic aberration and spherical aberration in a charged-particle beam having a large beam diameter as used in TEM. Furthermore, the chromatic and spherical aberrations are corrected simultaneously with two or three stages of multipole elements. Consequently, the optical system can be simplified. Hence, the charged-particle beam system can be miniaturized. This leads to a reduction in the manufacturing cost.

Other objects and features of the invention will appear in the course of the description thereof, which follows.

DESCRIPTION OF THE PREFERRED EMBODIMENTS

Figure 1:
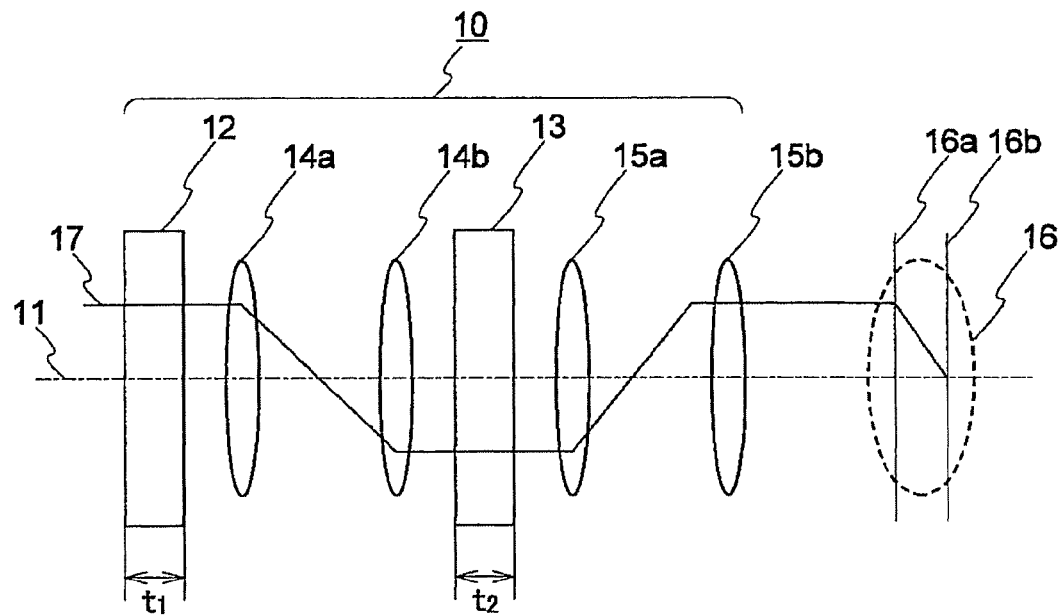
FIG. 1 is a schematic ray diagram of a chromatic aberration corrector associated with a first embodiment of the present invention.

The preferred embodiments of the present invention are hereinafter described with reference to the drawings. The present invention can be applied to charged particles, such as electrons, positrons, negative ions, or positive ions. In the following description of the embodiments, the treated charged-particle beam is assumed to be an electron beam, for the sake of convenience.

(Principle)

The principle is first described on which a concave lens effect of varying refractive index (i.e., the deflecting force depends on wavelength or on accelerating voltage) is produced by fields of 2-fold symmetry, which, in turn, are produced by multipole elements each having a thickness along the optical axis.

The meaning that the multipole element has a thickness is as follows. For example, a quadrupole element and a hexapole element fundamentally produce a symmetric field of 2-fold symmetry and a symmetric field of 3-fold symmetry, respectively. Where fields produced by the multipole elements are expanded with the multipole fields, the produced symmetric fields are referred to as primary terms. An actual multipole element produces quite weak fields by higher-order terms other than the primary terms. In a normal multipole element having no or little thickness, higher-order terms other than the primary terms are neglected in applications of the multipole elements or are merely parasitic factors. However, if the thickness of the multipole element is increased, the higher-order terms other than the primary terms manifest their effects. In order to make positive use of the effects, the multipole element is made to have a required length (or thickness) along the optical axis. A field produced by the multipole element has a "thickness."

2-fold astigmatism induced either by a static or magnetic field developed by a quadrupole element or by a 2-fold symmetric field developed by a superimposition of such static electric and magnetic fields is now discussed. The orbit of an electron beam given by complex representation is calculated. Let r be a position in a reciprocal space (focal plane). Let r' be a tilt (=∂r/∂z). Let Ω be a complex angle. Let Ω (=∂Ω/∂z) be a derivative of the complex angle. Let $A_2$ be a 2-fold astigmatism coefficient per unit length. Let $$\overline{\Omega}$$

be the complex conjugate of Ω. 2-fold astigmatism (geometrical aberration) is given by $$A_2 \Omega$$

Let $(r_0, r_0'), (r_1, r_1')$ be complex representations of the position and tilt of the electron beam at the entrance surface and exit surface, respectively, of the quadrupole element. It is assumed that the objective lens has a focal length of f. Where a specimen surface lies within the objective lens, if the position and tilt of the beam in this position are given by a reciprocal space, they are respectively given by $r=f\Omega$ and $r'=f\Omega'$.

It is assumed that the multipole element has a thickness t along the optical axis. The tilt of the beam at the exit surface of the multipole element is given by $$r_1' = r_0' + \sum_{n=1} \frac{\Omega_0}{(4n-1)!f^{4n-1}} |A_2|^{2n} t^{4n-1} + \qquad (1)$$

$$\sum_{n=1} \frac{\Omega_0'}{(4n)!f^{4n-1}} |A_2|^{2n} t^{4n} - \sum_{n=1} \frac{\overline{\Omega_0}}{(4n-3)!f^{4n-3}} A_2 \cdot |A_2|^{2(n-1)} t^{4n-3} -$$

$$\sum_{n=1} \frac{\overline{\Omega_0'}}{(4n-2)!f^{4n-3}} A_2 \cdot |A_2|^{2(n-1)} t^{4n-2}$$

where n is an integer (n>0).

In this equation, the terms having the coefficient $|A_2|^{2n}$ indicate a cylindrically symmetric lens action. Each term having the sign + indicates a concave lens action. On the other hand, the terms having the coefficient $A_2 \cdot |A_2|^{2(n-1)}$ indicate 2-fold astigmatism.

If the 2-fold astigmatism coefficient due to a 2-fold symmetrical electric field is given by $A_{E2}$, the strength $|A_{E2}|$ has a proportional relationship given by $$|A_{E2}| \propto \frac{1}{U} \qquad (2)$$

where U is an accelerating voltage. Similarly, in the case of a magnetic field of 2-fold symmetry, if the 2-fold astigmatism coefficient is given by $A_{B2}$, then the strength $|A_{B2}|$ has a proportional relationship given by $$|A_{B2}| \propto \frac{1}{\sqrt{U}} \qquad (3)$$

In an optical system having a concave lens action produced by a quadrupole field having a thickness, the indices of the coefficients $|A_2|$ of Eq. (1) are 2n and 2(n−1), respectively. If this is taken into consideration, the dependence of the deflecting force produced by the optical system on the accelerating voltage can be set so as to be in proportion to $1/U^N$ (where N is a positive integer) by a combination of terms associated with the coefficient $|A_2|$.

Also, in an optical system where electrical deflecting force and magnetic deflecting force on the electron beam accelerated by a given accelerating voltage cancel out each other, the coefficient $|A_2|$ assumes a finite value for the electron beam accelerated by an accelerating voltage different from the given accelerating voltage. Accordingly, the beam undergoes a concave lens action.

Where the objective lens of the focal distance f given by Eq. (1) is of the magnetic type, the deflecting force produced by this lens is generally given by $$\frac{1}{f} \propto \frac{1}{U} \qquad (4)$$

As described previously, the dependence of the deflecting force produced by the quadrupole element having a thickness on accelerating voltage is given by $1/U^N$. On the other hand, the dependence of the accelerating voltage U given by Eq. (4) is given by 1/U. That is, they differ greatly in dependence on accelerating voltage. Therefore, the quadrupole field having a thickness is different in refractive index from the objective lens. It can be seen that this difference makes it possible to apply the concave lens action of the quadrupole field having a thickness to correction of chromatic aberration in the objective lens.

As shown in Eq. (1), if the thickness of the quadrupole element is increased, the concave lens action becomes more intense. Therefore, it is possible to set the thickness t according to the required strength of the concave lens action.

As shown in the terms having the coefficient $A_2 \cdot |A_2|^{2(n-1)}$ of the right hand of Eq. (1), in the case of a single stage of quadrupole field, 2-fold astigmatism is newly produced. This 2-fold astigmatism can be removed by providing two stages of quadrupole elements as shown below.

2-fold symmetric fields produced respectively by the two stages of quadrupole elements are distributed analogously and anti-symmetrically. More specifically, two multipole elements of the same structure are disposed. Voltages or exciting currents of opposite polarities are applied to the two elements. If the two quadrupole elements are equal in thickness taken along the optical axis, the tilt $r_2'$ of the beam at the exit surface of the second stage of quadrupole element is given by $$r_2' = -2 \sum_{n=1} \frac{\Omega_0}{(4n-1)!f^{4n-1}} |A_2|^{2n} t^{4n-1} + \qquad (5)$$

$$\sum_{n=1} \sum_{m=1} \left[ \frac{-16mn+12n+12m-8}{(4n-2)!(4m-2)!} \right] \frac{\Omega_0}{f^{4n+4m-5}} |A_2|^{2n+2m-2} t^{4n+4m-5} +$$

$$\sum_{n=1} \sum_{m=1} \left[ \frac{16mn-4n-4m}{(4n)!(4m)!} \right] \frac{\Omega_0}{f^{4n+4m-1}} |A_2|^{2n+2m} t^{4n+4m-1}$$

where m and n are positive integers.

If the two stages of quadrupole elements are arranged with mutually opposite polarities as represented by this formula, the terms of the 2-fold astigmatism shown in Eq. (1) disappear. The terms having symbol + out of the terms of the right hand of the equation show concave lens action and, therefore, only cylindrically symmetrical lens action necessary for aberration correction is extracted.

The concave lens action of the two stages of quadrupole elements each having a thickness corrects chromatic aberration in the objective lens without producing 2-fold astigmatism similarly to the description made with reference to Eqs. (2)-(4).

The concave lens action increases with increasing the thickness t of each quadrupole element. Therefore, the thickness t can be set according to the required strength of the concave lens action.

If each of the two stages of quadrupole elements is of the magnetic field type, and if the transfer magnification is set to 1:1, the focal length $f_m$ is given by $$\frac{1}{f_m} = \frac{1}{3f^4}|A_{2m}|^2 t^3 = -\frac{2e\mu_0^2 N^2 I^2}{3mr_b^4 U} t^3 \qquad (6)$$

where $A_{2m}$, t, $r_b$, N, and I are 2-fold astigmatism coefficient of the magnetic quadrupole element, thickness along the optical axis, bore radius, number of turns of the exciting coil on the quadrupole element, and value of electrical current flowing through the coil, respectively. That is, NI indicates a magnetomotive force. U is an accelerating voltage by which the electron beam is accelerated. e is an elementary electric charge. m is the mass of an electron. $\mu_0$ is the free space magnetic permeability.

If each of the two stages of quadrupole elements is of the electric field type, and if the transfer magnification is 1:1, then the focal distance $f_e$ is given by the following Eq. (7):

$$\frac{1}{f_e} = \frac{1}{3f^4}|A_{2e}|^2 t^3 = -\frac{V_d^2}{3r_e^4 U^2} t^3 \qquad (7)$$

where $A_{2e}$, t, $r_e$, and $V_d$ are 2-fold astigmatism coefficient of the electric quadrupole element, thickness along the optical axis, bore radius, and voltage applied to each pole or electrode of the quadrupole element, respectively. The other variables have the same meanings as their counterparts used in Eq. (6).

In the aforementioned chromatic aberration correction system, there is a 2-fold symmetric electric or magnetic field. If this field greatly varies the orbit of the electron beam within the multipole element, it is difficult to correct chromatic aberration simultaneously with correction made using a geometrical aberration corrector, such as a spherical aberration corrector. Furthermore, if the electron beam is brought too close to an electrode or magnetic pole by the deflection caused by the 2-fold symmetric field, then the beam undergoes a force different from an optically designed and computed force by the effect of charging, thus presenting problems. In recent years, generally used spherical aberration correctors have employed 3-fold symmetric fields (see H. Rose, *Optik*, Vol. 85 (1990), pp. 19-24). In particular, when an electron beam moves through a multipole element, the beam moves closer to a magnetic pole, augmenting the deflecting force. This kind of spherical aberration corrector makes use of this principle. If the beam moves away from the magnetic pole within the multipole element and passes on the optical axis, the above-described principle no longer holds. In the above-described chromatic aberration correction system, if the electron beam is moved away from a pole element by a 2-fold symmetric field, it will be impossible to correct chromatic aberration and spherical aberration at the same time. Accordingly, these magnetic quadrupole and electric quadrupole elements are combined in a field superimposed multipole element. In this multipole element, the deflecting force of the accelerating voltage U on the electron beam is somewhat or considerably canceled out. The orbit is prevented from moving away from the pole element; otherwise, the beam would pass on the optical axis. If the orbit of the beam within the first multipole element is described up to the fourth power of t, then we have $$r_2 = -f \cdot \Omega_0 - \frac{1}{2f} A_2 \overline{\Omega}_0 t^2 + \frac{1}{8f^3}|A_2|^2 \Omega_0 t^4 \qquad (8)$$

The orbit of the electron beam is mainly altered by the second term regarding 2-fold astigmatism. The coefficient $A_2$ of this term satisfies Eqs. (6) and (7) and is given by the following relational formula.

$$A_2 = A_{e2} - A_{m2} \qquad (9)$$

It can be seen from Eq. (8) that magnetic 2-fold astigmatism and electric 2-fold astigmatism cancel out each other under a condition given by $$\frac{2f^2}{t^2} \geq |A_{e2} - A_{m2}| \qquad (10)$$

Under this condition, the position $r_2$ is prevented from greatly varying the orbit; otherwise, the beam would reach the axis ($r_2=0$).

When electrons enter in the static electric field of 2-fold symmetry produced by a multipole element, it has the effect of varying the speed of each electron depending on each position of the electron path in the multipole element. Where the electron beam is divergent, this effect comes down to the convergent effect of the electron beam, since the divergent effect becomes small as the speed of the electron beam increases.

On the other hand, where the electron beam is convergent, this effect, also, comes down to the convergent effect of the electron beam, since the convergent effect becomes big as the speed of the electron beam decreases. Hence, there remains a significant 4-fold astigmatism, possibly.

To correct such an aberration, a static electric or magnetic field of 4-fold symmetry is superimposed on the first multipole element and a static electric or magnetic field of 4-fold symmetry is superimposed on the second multipole element. Thus, each of 4-fold astigmatism produced by the first multipole element and the second multipole element is cancelled out, respectively.

Under the condition where electric and magnetic deflecting forces almost completely cancel out each other, spherical aberration correction can be made using plural 3-fold symmetric fields. That is, 3-fold symmetric fields produced by plural hexapole elements described in H. Rose, *Optik*, Vol. 85 (1990), pp. 19-24 produce negative spherical aberration. Consequently, positive spherical aberration in an objective lens can be canceled out. Accordingly, spherical and chromatic aberrations are corrected simultaneously by superimposing the 3-fold symmetric fields on the superimposed electric and magnetic fields produced by the above-described multipole elements.

In the description provided so far, apparatus having two stages of multipole elements have been discussed. As described previously, in order to correct chromatic and spherical aberrations simultaneously, static electric fields of 2- or 3-fold symmetry are necessary. As given by Eq. (7), as the thickness t of the electrode is increased, the voltage applied to the electrode decreases. Accordingly, there is the advantage that electrical discharging between electrodes can be suppressed. However, if the thickness t of the electrode is increased, 6-fold astigmatism increases due to a tendency given by Eq. (11).

$$A_6 = \frac{A_3^2 |A_3|^2}{14 f^6} t^7 \quad (11)$$

where $A_6$ and $A_3$ are a 6-fold astigmatism coefficient and a 3-fold astigmatism coefficient, respectively. As represented by this formula, the 6-fold astigmatism is in proportion to the seventh power of the thickness t of the electrode.

On the other hand, if three stages of multipole elements are used to correct spherical aberration, the 6-fold astigmatism coefficient $A_6$ is given by $$A_6 = \quad (12)$$
$$\frac{t^7}{f^6} \left( \frac{A_{31}^2 |A_{31}^2|}{420} + \frac{A_{32}^2 |A_{32}^2|}{420} + \frac{A_{33}^2 |A_{33}^2|}{420} + \frac{A_{31} A_{32} |A_{31}^2|}{30} + \frac{A_{31}^2 |A_{32}^2|}{30} - \frac{A_{31} A_{33} |A_{31}^2|}{30} + \frac{A_{31}^2 |A_{33}^2|}{30} - \frac{A_{31} A_{33} |A_{32}^2|}{15} - \frac{A_{31} A_{32} |A_{33}^2|}{15} + \frac{A_{32} A_{33} |A_{32}^2|}{30} + \frac{A_{32}^2 |A_{33}^2|}{30} \right)$$

where $A_{31}$, $A_{32}$, and $A_{33}$ are the 3-fold astigmatism coefficients of the first, second, and third stages of multipole elements, respectively. The 6-fold astigmatism is a function of the 3-fold astigmatism. If the 3-fold astigmatism is rotated about the optical axis, the 6-fold astigmatism will be reduced. In consequence, it is possible to build an optical system that produces little 6-fold astigmatism while correcting spherical aberration. Because the electrode thickness can be increased, the voltage applied during chromatic aberration correction can be lowered. Electric field quadrupole elements used for chromatic aberration correction may be mounted on any two of the three stages of multipole elements.

It is known that where the electron beam is in line focus, if a 4-fold astigmatic field is superimposed, negative spherical aberration is produced (see the above-cited O. Scherzer). In a 4-fold astigmatic field, a diverging field and a converging field repeatedly appear (each four times) regarding the electron beam within an angular range from 0° to 360°. The aberration order is the third order in the same way as in spherical aberration. Where third-order negative spherical aberration is produced, it is necessary to extract only the diverging field of the 4-fold astigmatism. When an electron beam is in line focus, the beam has no size in a direction relative to the optical axis, while the beam has finite size in the other directions. A method of correcting spherical aberration by making use of line focusing utilizes the following principle. The beam hardly undergoes the force from the superimposed fields in locations close to the optical axis. However, as the beam moves away from the optical axis and closer to the multipole element, the electron beam undergoes to a larger extent the force from the fields created by the multipole element. We have noticed the fact that if the electron beam deviates at all from a cylindrically symmetrical state and assumes an elliptical form having 2-fold astigmatism, this principle can be applied to correction of spherical aberration. In practice, it has been found as a result of an analysis that when a beam has 2-fold astigmatism, if a 4-fold field is superimposed on the beam, negative spherical aberration (−Cs) is produced as given by Eq. (13).

$$-Cs \propto A_2 \cdot A_4 \quad (13)$$

where $A_2$ and $A_4$ are the magnitude of 2-fold astigmatism and the magnitude of 4-fold astigmatism, respectively. In this way, chromatic and spherical aberrations can be corrected simultaneously even if a 4-fold astigmatic field is superimposed. Note that the superimposed 4-fold astigmatic field must have a certain azimuthal relationship to the 2-fold astigmatic field. That is, it is necessary that the direction in which the electron beam being remote from the optical axis and created by the already existing 2-fold astigmatism be aligned to the direction of divergence of the 4-fold astigmatic field. 2-fold astigmatic fields applied to correct chromatic aberration have angular relationships of 0° and 90° in two multipole elements. In contrast, 4-fold astigmatic fields satisfying the above-described conditions have the same phase angle because they have 4-fold symmetry. That is, the 4-fold astigmatic fields applied to the two multipole elements are in the same direction. Therefore, the astigmatic fields do not cancel out each other. Consequently, after spherical aberration has been corrected, 4-fold astigmatism remains. For these reasons, it may be necessary to correct the 4-fold astigmatism by separate means. Thus, a third multipole element is prepared to correct the residual 4-fold astigmatism produced by the first multipole element and the second multipole element.

A method to compensate for the 4-fold astigmatism is to make another aberration having the same magnitude and the opposite sign as that of the original aberration. To make such an aberration, at least three multipole elements are required since the method needs two sets of 4-fold astigmatism aberrations.

In the case of four multipole elements, the 4-fold astigmatism from the first and second multipole elements is eliminated by the negative astigmatism from the third and fourth multipole elements.

In the case of three multipole elements, the 4-fold astigmatism from the first and second multipole elements may be eliminated by the negative astigmatism from the second and third multipole elements.

As described so far, in any case, chromatic aberration can be corrected without performing line focusing. Therefore, spherical aberration can be corrected at the same time. Consequently, chromatic and spherical aberrations can be corrected simultaneously for a charged-particle beam having a large beam diameter as used in TEM.

(Embodiments)

Figure 2A:
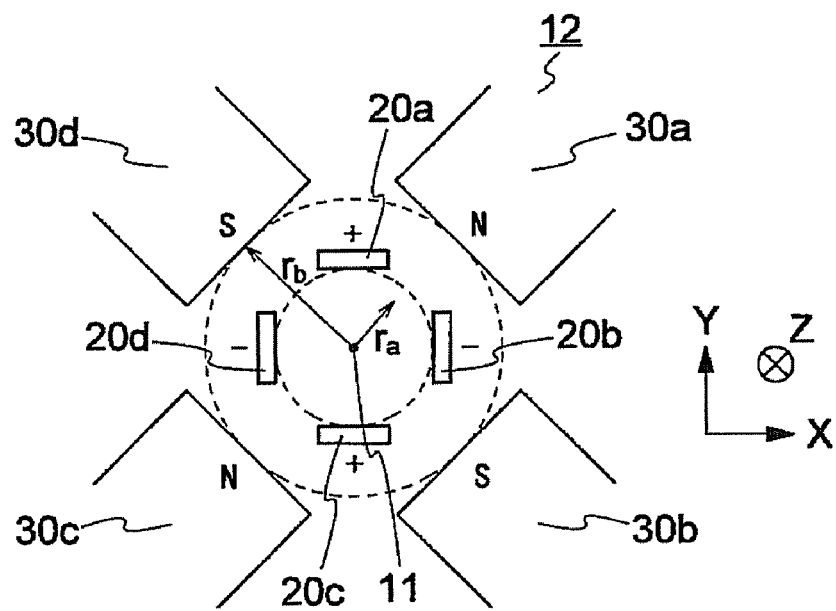
FIG. 2a illustrates the configuration of one multipole element in the chromatic aberration corrector associated with the first embodiment of the present invention, the multipole element having four magnetic poles.

Embodiments of the present invention are hereinafter described. FIG. 1 is a schematic ray diagram of a chromatic aberration corrector associated with one embodiment of the present invention. FIG. 2a schematically illustrates the configuration of multipole elements in the chromatic aberration corrector shown in FIG. 1, each of the multipole elements using superimposed electric and magnetic fields. In the present embodiment, this chromatic aberration corrector is used in a transmission electron microscope (TEM).

Referring to FIG. 1, the chromatic aberration corrector associated with one embodiment of the present invention is indicated by reference numeral 10 and has a first multipole element 12 and a second multipole element 13 arranged along the optical axis 11 of a charged-particle beam. The second element 13 is located behind the first element 12.

The first multipole element 12 has a thickness of $t_i$ along the direction of the optical axis and produces a first static electric field of 3-fold symmetry and a first static electromagnetic field of 2-fold symmetry superimposed on the first static electric field. The second multipole element 13 has a thickness of $t_2$ along the direction of the optical axis and produces a second static magnetic field of 3-fold symmetry and a second static electromagnetic field of 2-fold symmetry superimposed on the second static magnetic field.

Furthermore, the chromatic aberration corrector 10 has transfer lenses of a pair (14a and 14b) mounted between the multipole elements 12 and 13 and having a transfer magnification of 1:1 and transfer lenses of a pair (15a and 15b) mounted between an objective lens 16 and the second multipole element 13 and having a transfer magnification of 1:1

Each of the multipole elements 12 and 13 has plural magnetic poles and electrodes regularly arranged around the optical axis 11. FIG. 2a shows one example of the multipole element 12. As shown in the figure, the multipole element 12 has quadrupolar electrodes 20a-20d and quadrupolar magnetic poles 30a-30d around the optical axis 11 extending in the direction of the Z-axis. The electrodes 20a-20d define a bore diameter $r_a$. The magnetic poles 30a-30d define a bore diameter $r_b$.

The electrodes 20a-20d are angularly spaced at intervals of 90° on a plane (XY-plane) perpendicular to the optical axis 11. Voltages applied to the electrodes 20a-20d have the same absolute value but have alternating polarity. Because the applied voltages are so set as to satisfy Eq. (10), an electric field contributing to the first static electromagnetic field is produced. Since a magnetic field needs to be distributed around the optical axis 11, the electrodes 20a-20d are made of a nonmagnetic material.

Figure 6A:
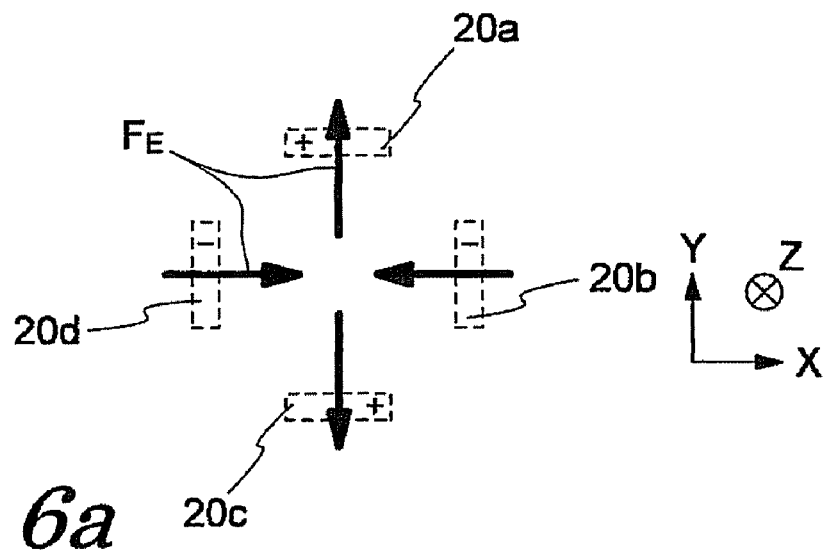
FIG. 6a illustrates forces that an electron beam undergoes when there is an electric field quadrupole.
Figure 6B:
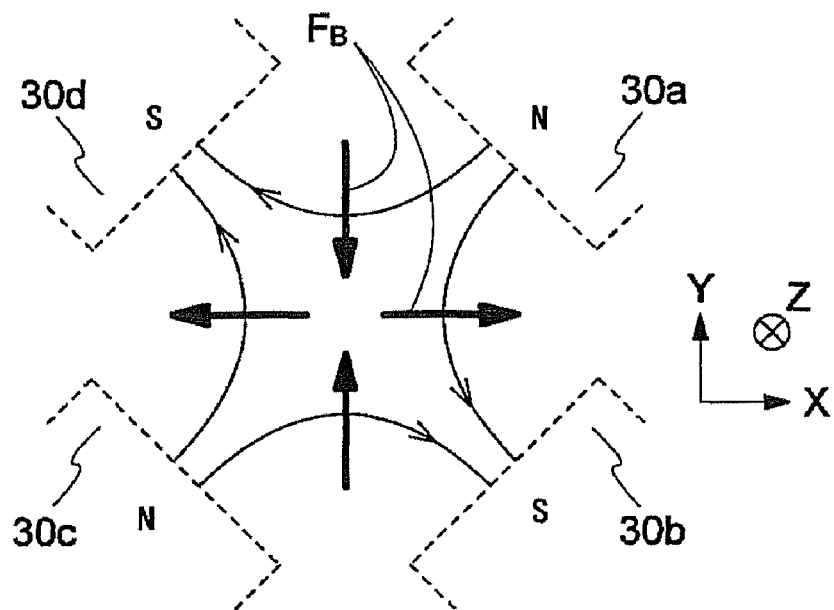
FIG. 6b illustrates forces that an electron beam undergoes when there is a magnetic field quadrupole.

The magnetic poles 30a-30d are angularly spaced at intervals of 90° on a plane perpendicular to the optical axis 11. An exciting coil (not shown) having a number of turns N of wire is wound on a rear-end portion (not shown) of each of the magnetic poles 30a-30d. An electrical current I flows through the exciting coil. Accordingly, the magnetomotive force of each magnetic pole is NI. Each exciting coil is connected with a separate current source (not shown). The magnetomotive force is set at will. As shown in FIGS. 6a and 6b, forces $F_E$ that the electron beam undergoes from an electric field quadrupole and forces $F_B$ that the beam undergoes from a magnetic field quadrupole are applied in such directions that the forces cancel out each other almost fully.

The second multipole element 13 has electrodes and magnetic poles in the same way as the first multipole element 12. The electrodes and magnetic poles are physically arranged similarly to the configuration of FIG. 2a except that their polarities are reversed compared with the first multipole element 12. That is, when viewed from the optical axis 11, the polarities of the multipole element 13 have been rotated through 90° relative to the polarities of the multipole element 12 shown in FIG. 2a.

Figure 2B:
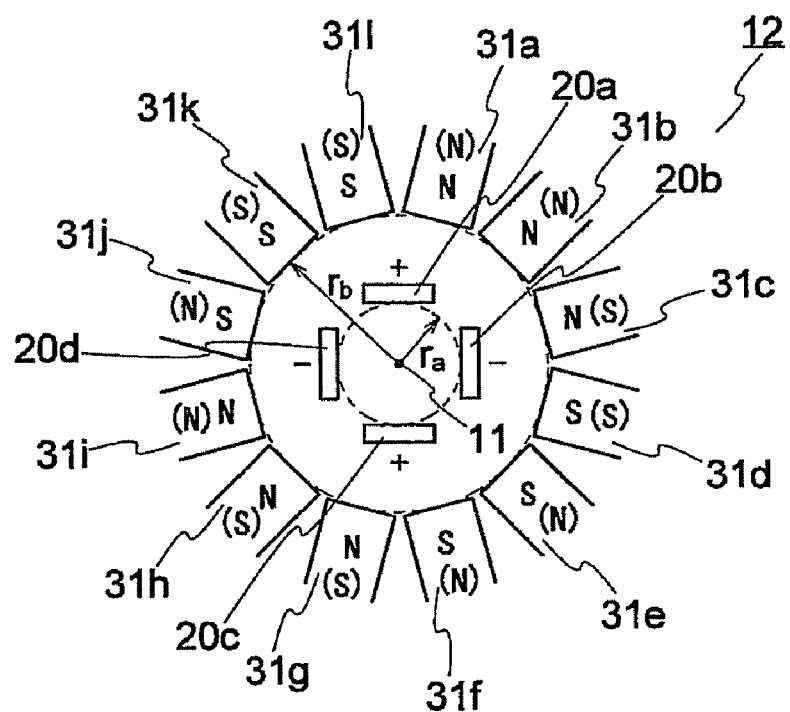
FIG. 2b illustrates the configuration of a multipole element in the chromatic aberration corrector associated with the first embodiment, the multipole element having 12 magnetic poles.

As shown in FIG. 2b, the number of magnetic poles formed on each of the multipole elements 12 and 13 may be changed from 4 to 12. In this case, a 3-fold symmetric field can be superimposed on the electric field and magnetic field quadrupole elements. In FIG. 2a, magnetic poles producing 2-fold symmetric fields are indicated by N and S poles. Magnetic poles producing 3-fold symmetric fields are indicated by N and S poles. That is, with respect to magnetic fields developed by the magnetic poles, a magnetic field producing a 2-fold symmetric field and a magnetic field producing a 3-fold symmetric field are combined into one. Each of the magnetic poles 31a-311 of the dodecapole (12 poles) is connected with a separate exciting coil (not shown) and a separate current source (not shown). Thus, each magnetic pole can produce a magnetomotive force separately. Consequently, 3-fold symmetric magnetic fields for correcting spherical aberration and a magnetic field distribution for correcting chromatic aberration can be produced more appropriately.

The pair of transfer lenses 14a and 14b transfers a reciprocal space image of the electron beam 17 formed by the first multipole element 12 to the second multipole element 13. The pair of transfer lenses 14a and 14b is arranged for the following reason.

When chromatic aberration is corrected in TEM, it is necessary that the correction be made uniformly over the whole field of the electron beam 17 spanning the whole field of view. For this correction, a deflecting action must be applied to the beam 17 only in a space not dependent on the position of the beam 17. The space not dependent on the position of the beam 17 corresponds to positions where a reciprocal space image of the beam 17 is obtained. The reciprocal space image appears in the center of the first multipole element 12. This image needs to be transferred to the second multipole element 13. Accordingly, the pair of transfer lenses 14a and 14b is disposed between the multipole elements 12 and 13.

The pair of transfer lenses 15a and 15b transfers the reciprocal space image of the electron beam 17 appearing in the second multipole element 13 to a coma-free plane 16a of the objective lens. This plane is substantially identical with the front focal plane of the objective lens. The reciprocal space image transferred to the coma-free plane 16a becomes a real space image at the specimen surface 16b of the objective lens. Because positive chromatic aberration and positive spherical aberration in the objective lens are canceled out by negative chromatic aberration and negative spherical aberration produced by the optical systems of the multipole elements 12 and 13, the real space image of the electron beam 17 on the specimen surface is affected neither by the chromatic aberration nor by the spherical aberration.

Figure 3:
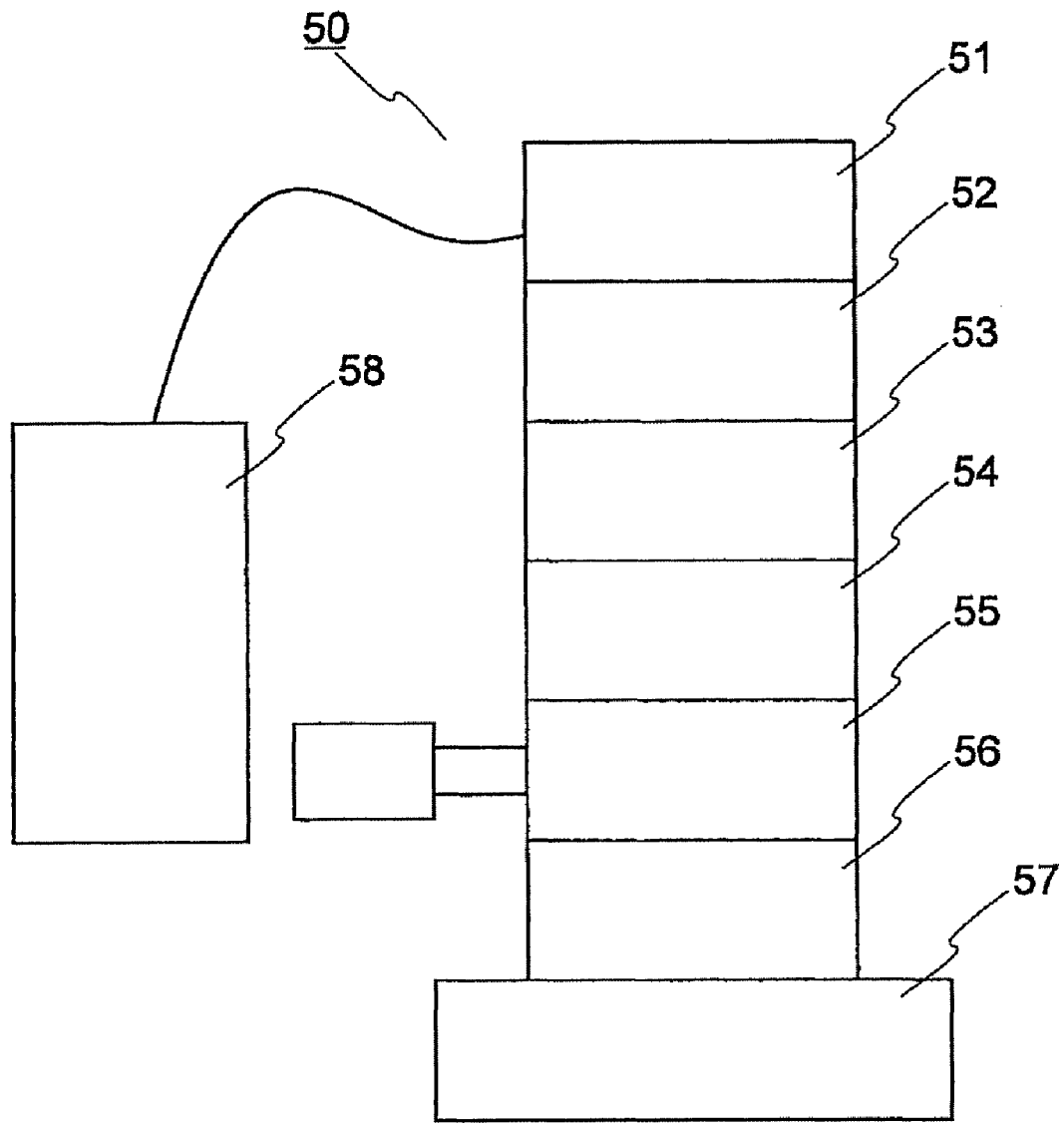
FIG. 3 is a schematic diagram of a chromatic aberration corrector associated with one embodiment of the present invention, and in which the corrector is mounted in a transmission electron microscope.

FIG. 3 shows an example of a transmission electron microscope (TEM) in which a chromatic aberration corrector of the present invention is used as an aberration corrector for the illumination system. The TEM, indicated by 50, has an electron gun 51 that is made to produce an electron gun (not shown) under control of a high voltage control portion 58. The beam is accelerated to a desired energy. The accelerated beam is then focused by a first condenser lens 52. The focused beam passes through the aberration corrector 53 for the illumination system. At this time, the above-described aberration correction is made. The beam passed through the aberration corrector 53 is focused by a second condenser lens 54 and passes through an objective lens and specimen stage 55. A specimen is placed on the specimen stage.

The electron beam transmitted through the specimen is magnified by an intermediate projector lens 56 and impinges on a fluorescent screen (not shown) on an observation chamber 57. The specimen image projected on the fluorescent screen is captured by a camera or other device.

When the beam passes through the objective lens and specimen stage 55, the objective lens further focuses the beam. At this time, positive spherical aberration in the objective lens operates to increase the diameter of the spot of the beam on the specimen surface. However, the positive spherical aberration is canceled out by the negative spherical aberration produced by the aberration corrector 53 for the illumination system. Action of increasing the diameter of the spot of the beam is also produced by the positive chromatic aberration in the objective lens. Also, in this case, the positive chromatic aberration in the objective lens is canceled out by the negative chromatic aberration produced by the aberration corrector 53 for the illumination system, in the same way as the foregoing. Accordingly, the electron beam that is affected neither by spherical aberration nor by chromatic aberration on the specimen surface illuminates a wide area, thus improving the spatial resolution.

Where the chromatic aberration corrector of the present invention is installed in a charged-particle beam system, such as a SEM or STEM, having an optical system similar to that of the TEM 50, an electron beam which has a quite small diameter and which suffers from a less amount of blur than conventional is obtained. Consequently, the spatial resolution is improved also in this case.

Figure 5:
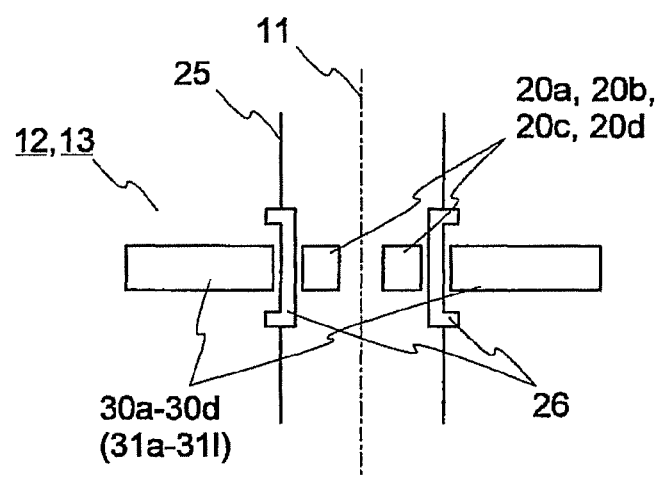
FIG. 5 is a cross-sectional view showing modifications of the chromatic aberration correctors shown in FIGS. 4a and 4b.
Figure 4A:
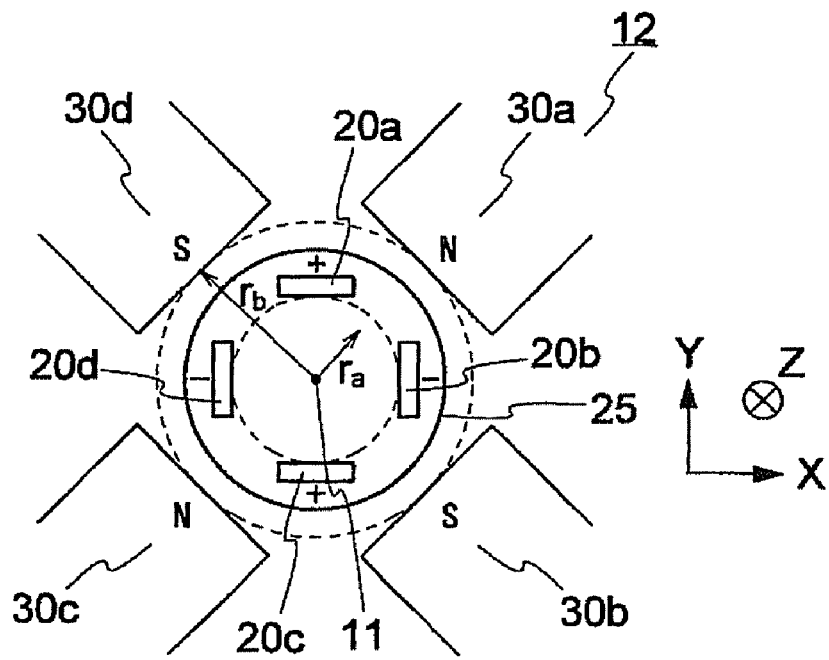
FIG. 4a illustrates a modification of the chromatic aberration corrector shown in FIG. 2a, and in which the four magnetic poles are mounted outside a vacuum.
Figure 4B:
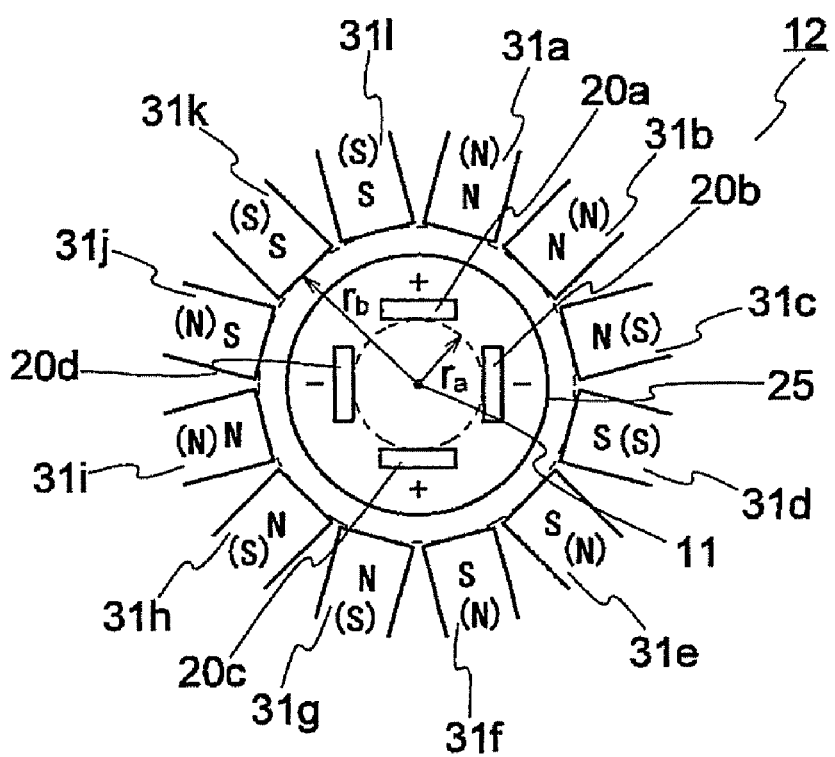
FIG. 4b illustrates a modification of the chromatic aberration corrector shown in FIG. 2b, and in which the 12 magnetic poles are mounted outside a vacuum.

(Modifications)

Where each of the first multipole element 12 and the second multipole element 13 uses a first static magnetic field and a second static magnetic field, the magnetic poles may be mounted outside a vacuum. FIGS. 4a and 4b show examples in which the magnetic poles shown in FIGS. 2a and 2b are mounted outside the vacuum. The electrodes 20a-20d are disposed inside a liner tube 25 through which the electron beam is transmitted, while the magnetic poles 30a-30f or 31a-311 are disposed outside the liner tube 25. In this case, as shown in FIG. 5, electrical current introduction circuits 26 are mounted to maintain the vacuum inside the liner tube 25 and to permit application of voltages to the electrodes 20a-20d.

In correcting chromatic aberration using the chromatic and spherical aberration corrector of the present invention, the condition imposed on the first and second multipole elements 12 and 13 is given by Eq. (1). Therefore, as long as Eq. (10) is obeyed, the thicknesses $t_1$ and $t_2$ of the multipole elements may be different. Where the chromatic aberration corrector of the present invention is used for correction of chromatic aberration in the STEM mode of TEM or in SEM, it is not necessary to obtain a reciprocal space image over every direction (i.e., x- and y-directions as described already in the description of the related art) perpendicular to the optical axis 11. Consequently, at least one pair of the transfer lenses 14a, 14b and 15a, 15b described in the above embodiment may be omitted.

Furthermore, the first and second static electromagnetic fields may be of 3-fold symmetry. In this case, the quadrupolar electrodes 20a-20d shown in FIGS. 2a and 2b are replaced by hexapolar electrodes to produce a hexapolar electric field satisfying the requirement given by Eq. (10). A static magnetic field of 3-fold symmetry produced by the magnetic poles 30a-30f and satisfying Eq. (10) is superimposed on the hexapolar electric field. Thus, electric and magnetic deflecting forces applied by the electric and magnetic fields to the electron beam accelerated by the accelerating voltage U cancel out each other. Consequently, chromatic aberration can be corrected. In addition, chromatic and spherical aberrations are corrected simultaneously by producing magnetic fields necessary for the spherical aberration correction by means of the magnetic poles 30a-30f.

It is also possible to mount three stages of multipole elements to produce a static magnetic field of 3-fold symmetry associated with correction of spherical aberration. Magnetic poles and electrodes producing a static electromagnetic field of 2- or 3-fold symmetry for correcting chromatic aberration may be mounted on any two of the three stages of multipole elements. In this case, chromatic aberration can be corrected by producing a static electromagnetic field satisfying Eq. (10) by means of the multipole elements having the magnetic poles and electrodes producing the static electromagnetic field of 2- or 3-fold symmetry and superimposing the static magnetic field of 3-fold symmetry. At the same time, spherical aberration can be corrected. The corrector can also be utilized in TEM if transfer lenses having a transfer magnification of 1:1 are mounted between the multipole elements. Additionally, similar transfer lenses may be mounted between the multipole element of the three stages of multipole elements which is adjacent to the objective lens and the objective lens.

In any of the above examples, chromatic aberration is corrected while magnetic and electric deflecting forces exerted on the electron beam accelerated by the accelerating voltage U cancel out each other. At the same time, spherical aberration can be corrected. In addition, the corrector can be applied to simultaneous correction of chromatic and spherical aberrations in a charged-particle beam having a large beam diameter as used in TEM. Further, the optical system is simplified because chromatic and spherical aberrations are corrected simultaneously by two or three stages of multipole elements. Accordingly, the charged-particle beam system can be reduced in size. This leads to a reduction in the manufacturing cost.

Having thus described our invention with the detail and particularity required by the Patent Laws, what is desired protected by Letters Patent is set forth in the following claims.

The invention claimed is:

1. A chromatic aberration corrector for use with a charged-particle beam system using a charged-particle beam having an optical axis, said chromatic aberration corrector comprising:

a first multipole element having a first thickness along the optical axis of the charged-particle beam and producing a first static electromagnetic field of 2-fold symmetry; and a second multipole element mounted on the optical axis, having a second thickness along the optical axis, and producing a second static electromagnetic field of 2-fold symmetry, wherein when the charged-particle beam is accelerated by a given accelerating voltage, the first and second static electromagnetic fields cancel out 2-fold astigmatism in the charged-particle beam while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of an objective lens, wherein chromatic and spherical aberrations are corrected simultaneously by superimposing a static electric or magnetic field of 3-fold symmetry on said first multipole element and superimposing a static electric or magnetic field of 3-fold symmetry on said second multipole element.

2. A chromatic aberration corrector as set forth in claim 1, further comprising a third multipole element which is mounted on the optical axis, has a third thickness along the optical axis, and produces a third static electric or magnetic field of 3-fold symmetry.

3. A chromatic aberration corrector for use with a charged-particle beam system using a charged-particle beam having an optical axis, said chromatic aberration corrector comprising:

a first multipole element having a first thickness along the optical axis of the charged-particle beam and producing a first static electromagnetic field of 2-fold symmetry; and a second multipole element mounted on the optical axis, having a second thickness along the optical axis, and producing a second static electromagnetic field of 2-fold symmetry, wherein when the charged-particle beam is accelerated by a given accelerating voltage, the first and second static electromagnetic fields cancel out 2-fold astigmatism in the charged-particle beam while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of an objective lens, wherein chromatic and spherical aberrations are corrected simultaneously by superimposing:
- a static electric or magnetic field of 4-fold symmetry on said first multipole element; and
- a static electric or magnetic field of 4-fold symmetry on said second multipole element.

4. A chromatic aberration corrector as set forth in claim 3, further comprising a third multipole element which is mounted on the optical axis, has a third thickness along the optical axis, and produces a third static electric or magnetic field of 4-fold symmetry.

5. A chromatic aberration corrector as set forth in claim 3, further comprising:
- a third multipole element which is mounted on the optical axis, has a third thickness along the optical axis, and produces a third static electromagnetic field by superimposing a static electromagnetic field of 2-fold symmetry and a static electric or magnetic field of 4-fold symmetry; and
- a fourth multipole element which is mounted on the optical axis, has a fourth thickness along the optical axis, and produces a fourth static electromagnetic field by superimposing a static electromagnetic field of 2-fold symmetry and a static electric or magnetic field of 4-fold symmetry.

6. A chromatic aberration corrector as set forth in claim 1 or 3, further comprising a first pair of transfer lenses mounted between the multipole elements.

7. A chromatic aberration corrector as set forth in claim 6, further comprising a second pair of transfer lenses mounted between one of the multipole elements which is adjacent to an objective lens of the charged-particle beam system and the objective lens.

8. A chromatic aberration corrector as set forth in claim 1, wherein said first thickness and said second thickness are different.

9. A chromatic aberration corrector as set forth in claim 1, wherein each of said first and second multipole elements has a quadrupole as poles for producing magnetic fields.

10. A chromatic aberration corrector as set forth in claim 1, wherein each of said first and second multipole elements has a dodecapole as poles for producing magnetic fields.

11. A chromatic aberration corrector as set forth in claim 1 or 3,
wherein said first multipole element has first electrodes producing a static electric field for creating said first static electromagnetic field and first magnetic poles producing a static magnetic field for creating said first static electromagnetic field,
wherein said first electrodes are located inside a vacuum, while said first magnetic poles are located outside the vacuum,
wherein said second multipole element has second electrodes producing a static electric field for creating said second static electromagnetic field and second magnetic poles producing a static magnetic field for creating said second static electromagnetic field, and
wherein said second electrodes are located inside the vacuum, while said second magnetic poles are located outside the vacuum.

12. A method of correcting chromatic aberration in a charged-particle beam system, said method comprising the steps of:
producing a first static electromagnetic field of 2-fold symmetry along an optical axis of a charged-particle beam;
producing a second static electromagnetic field of 2-fold symmetry along the optical axis; and
causing said first and second static electromagnetic fields to cancel out 2-fold astigmatism in the charged-particle beam when the charged-particle beam is accelerated by a given accelerating voltage while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of an objective lens,
wherein chromatic and spherical aberrations are corrected simultaneously by superimposing a static electric or magnetic field of 3-fold symmetry on said first static electromagnetic field and superimposing a static electric or magnetic field of 3-fold symmetry on said second static electromagnetic field.

13. A method of correcting chromatic aberration as set forth in claim 12, further comprising the step of producing a third static electric or magnetic field of 3-fold symmetry using a third multipole element which is mounted on the optical axis, and has a third thickness along the optical axis.

14. A method of correcting chromatic aberration in a charged-particle beam system, said method comprising the steps of:
producing a first static electromagnetic field of 2-fold symmetry along an optical axis of a charged-particle beam;
producing a second static electromagnetic field of 2-fold symmetry along the optical axis; and
causing said first and second static electromagnetic fields to cancel out 2-fold astigmatism in the charged-particle beam when the charged-particle beam is accelerated by a given accelerating voltage while satisfying a condition given by $$\frac{2f^2}{t^2} \geq |A_{e2} - A_{m2}|$$

where $A_{e2}$ is the amount of 2-fold astigmatism per unit length produced by an electric field quadrupole, $A_{m2}$ is the amount of 2-fold astigmatism per unit length produced by a magnetic field quadrupole, t is the length (thickness) of each multipole element taken in the direction of the beam, and f is the focal distance of an objective lens, wherein chromatic and spherical aberrations are corrected simultaneously by superimposing:

a static electric or magnetic field of 4-fold symmetry on said first static electromagnetic field; and a static electric or magnetic field of 4-fold symmetry on said second static electromagnetic field.

15. A method of correcting chromatic aberration as set forth in claim 14, further comprising the step of producing a third static electric or magnetic field of 4-fold symmetry using a third multipole element which is mounted on the optical axis, and has a third thickness along the optical axis.

16. A method of correcting chromatic aberration as set forth in claim 14, further comprising the steps of:

producing a third static electromagnetic field by superimposing the static electromagnetic field of 2-fold symmetry and the electric or magnetic field of 4-fold symmetry using a third multipole element which is mounted on the optical axis, and has a third thickness along the optical axis;

producing a fourth static electromagnetic field by superimposing the static electromagnetic field of 2-fold symmetry and the electric or magnetic field of 4-fold symmetry using a fourth multipole element which is mounted on the optical axis, and has a fourth thickness along the optical axis; and causing each of the 4-fold astigmatism produced by said first static electromagnetic field of 2-fold symmetry and said second static electromagnetic field of 2-fold symmetry are cancelled out, respectively.

\* \* \* \* \*